United States Patent
Scott et al.

(10) Patent No.: US 7,210,002 B2
(45) Date of Patent: Apr. 24, 2007

(54) SYSTEM AND METHOD FOR OPERATING DUAL BANK READ-WHILE-WRITE FLASH

(75) Inventors: Clifton E. Scott, San Diego, CA (US); John Gatti, San Diego, CA (US); Laxmi Rayapudi, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 168 days.

(21) Appl. No.: 10/718,279

(22) Filed: Nov. 19, 2003

(65) Prior Publication Data
US 2005/0108467 A1 May 19, 2005

(51) Int. Cl.
*G06F 12/00* (2006.01)

(52) U.S. Cl. .............. 711/103; 711/5; 711/173; 711/2; 711/202; 711/165; 365/185.33; 365/189.04

(58) Field of Classification Search .............. 711/103, 711/102, 173, 129, 5; 365/185.33, 189.04
See application file for complete search history.

(56) References Cited

U.S. PATENT DOCUMENTS

| | | | |
|---|---|---|---|
| 5,544,356 A * | 8/1996 | Robinson et al. ........... 707/205 |
| 6,032,248 A | 2/2000 | Curry et al. | |
| 6,275,894 B1 * | 8/2001 | Kuo et al. .................. 711/103 |
| 6,324,628 B1 * | 11/2001 | Chan .......................... 711/163 |
| 6,401,160 B1 * | 6/2002 | See et al. ....................... 711/5 |
| 6,407,949 B1 | 6/2002 | Jha et al. | |
| 6,493,788 B1 | 12/2002 | Sun et al. | |
| 2002/0169923 A1 * | 11/2002 | Chen ......................... 711/103 |
| 2003/0035322 A1 * | 2/2003 | Wong ..................... 365/185.33 |
| 2003/0058689 A1 * | 3/2003 | Marotta ................. 365/185.13 |
| 2004/0064636 A1 * | 4/2004 | Yoshii et al. ............... 711/103 |
| 2004/0177054 A1 * | 9/2004 | Stern et al. .................... 707/1 |
| 2004/0206981 A1 * | 10/2004 | Gross et al. ................ 257/199 |

FOREIGN PATENT DOCUMENTS

| EP | 0 788 115 A2 | 8/1997 |
| EP | 1 229 701 A1 | 8/2002 |
| EP | 1 345 236 A1 | 9/2003 |

* cited by examiner

*Primary Examiner*—Matthew Kim
*Assistant Examiner*—Ryan A. Dare
(74) *Attorney, Agent, or Firm*—Thomas Rouse; Sandip "Micky" Minhas; Abdollah Katbab

(57) ABSTRACT

The disclosed embodiments provide for a system and method for storing data in a flash memory device that has a code bank and a data bank. The method includes writing data to the data bank under control of a flash driver in the code bank when sufficient space is expected to exist in the data bank. Otherwise, the method includes writing data to the code bank under control of a flash driver in a storage device that is external to the flash memory device.

20 Claims, 1 Drawing Sheet

SYSTEM AND METHOD FOR OPERATING DUAL BANK READ-WHILE-WRITE FLASH

FIELD

The present invention relates generally to wireless communication systems, and more particularly to memory devices used by wireless communication devices.

BACKGROUND

Wireless communication devices have become ubiquitous. Devices such as wireless telephones include so-called mobile station modems (MSM) that essentially are wireless communication computers which, like all digital computers, execute software to undertake the functions desired by the user. Typically, a wireless communication device MSM includes a core processor that accesses random access memory (RAM) to store data, and flash memory to store software.

To achieve greater system robustness, flash memory devices have been introduced that can simultaneously read data and write data, and accordingly are referred to as read-while-write flash devices. To facilitate read-while-write, portions of such flash devices include a so-called code bank, in which the software driver of the flash memory device is stored and executed in cooperation with the MSM processor, and a data bank, in which various software code is stored. As an example, a wireless telephone may allow a user to download games into the data bank under control of the flash driver in the code bank.

Presently, once the data bank is full, no further data can be downloaded, even if spare space exists in the code bank. This is because the flash driver in the code bank cannot control flash memory operation, a condition necessary for storing data in the flash device, while data simultaneously is being written to its own dedicated code bank. Accordingly, since the bank sizes of read-while-write flash memory devices cannot be dynamically changed, the only way to provide the user with more flash memory space is to replace the existing flash memory with a higher capacity memory. This is time consuming and bothersome for the manufacturer since it requires a new revision of the phone hardware and concomitant regression testing.

SUMMARY

A method for storing data in a flash memory device that has a code bank and a data bank includes writing data to the data bank under control of a flash driver in the code bank when sufficient space is expected to exist in the data bank. Otherwise, the method includes writing data to the code bank under control of a flash driver in a storage device that is external to the flash memory device.

In one embodiment, the flash memory device is accessed by a wireless communication device processor. The storage device that is external to the flash memory device may be a RAM accessed by the processor. Copies of the flash driver may be in both the RAM and the code bank, if desired. The method may include preventing the flash driver from accessing code in the code bank when performing operations on the flash memory device.

In another aspect, a wireless communication device includes a processor, a RAM communicating with the processor, and a read-while-write flash memory device communicating with the processor. A flash driver controls operation of the flash memory device, with the flash driver being executable from the RAM.

In still another aspect, a wireless communication device includes a MSM processor, a RAM accessed by the processor, and a flash memory accessed by the processor. The processor writes data to the flash memory by accessing a flash driver instantiated in the RAM.

In yet another aspect, a system for storing data in a flash memory device having at least a code bank and a data bank includes means for writing data to the data bank under control of a flash driver in the code bank when sufficient space is expected to exist in the data bank. The system also includes means for otherwise writing data to the code bank under control of a flash driver in a storage device external to the flash memory device.

DETAILED DESCRIPTION

Figure 1:
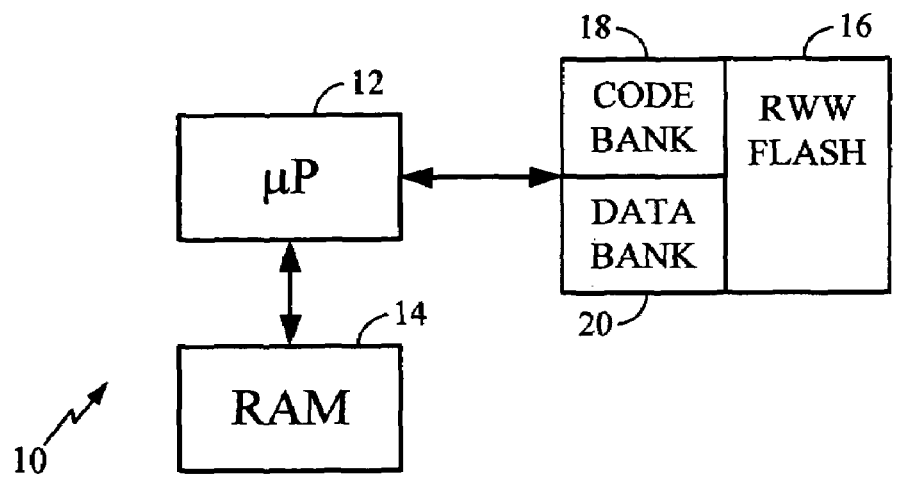
FIG. 1 is a block diagram of the present system.

Referring initially to FIG. 1, a wireless communication device is shown, generally designated 10, for facilitating computer data and/or voice communication in a radio access network. In one non-limiting implementation, the device 10 is a code division multiple access (CDMA) mobile station that, e.g., uses cdma2000, cdma2000 1x, or cdma2000 high data rate (HDR) principles, or other CDMA principles. In one non-limiting embodiment, the wireless communication device 10 is a mobile telephone made by Kyocera, Samsung, or other manufacturer that uses Code Division Multiple Access (CDMA) principles and CDMA over-the-air (OTA) communication air interfaces. The disclosed embodiments, however, apply to other mobile stations such as laptop computers, wireless handsets or telephones, data transceivers, or paging and position determination receivers. The wireless communication device 10 can be hand-held or portable as in vehicle-mounted (including cars, trucks, boats, planes, trains), as desired. However, while wireless communication devices are generally viewed as being mobile, it is to be understood that the disclosed embodiments can be applied to "fixed" units in some implementations. Also, the disclosed embodiments apply to data modules or modems used to transfer voice and/or data information including digitized video information, and may communicate with other devices using wired or wireless links. Further, commands might be used to cause modems or modules to work in a predetermined coordinated or associated manner to transfer information over multiple communication channels. Wireless communication devices are also sometimes referred to as user terminals, mobile stations, mobile units, subscriber units, mobile radios or radiotelephones, wireless units, or simply as "users" and "mobiles" in some communication systems. It is to be understood that the disclosed embodiments apply equally to other types of wireless devices including without limitation GSM devices, time division multiple access (TDMA) systems, etc.

FIG. 1 shows that the wireless communication device 10 embodies a mobile station modem (MSM) that includes a processor 12. The wireless communication device 10 can also include random access memory (RAM) 14 for, e.g., storing non-program data. The RAM 14 may be, e.g., static RAM (SRAM) or synchronous dynamic RAM (SDRAM) or other type of RAM.

The wireless communication device 10 can also contain memory such as flash memory 16 for, e.g., storing program code. More specifically, as shown in FIG. 1, the flash memory 16 includes a so-called read-while-write flash that has at least two banks, a code bank 18 and a data bank 20. Applications that are executed by the processor 12 can reside in the code bank 18. On the other hand, application data such as user settings are stored in the data bank 20, but as set forth further below such data can also be stored in the code bank 18.

Figure 2:
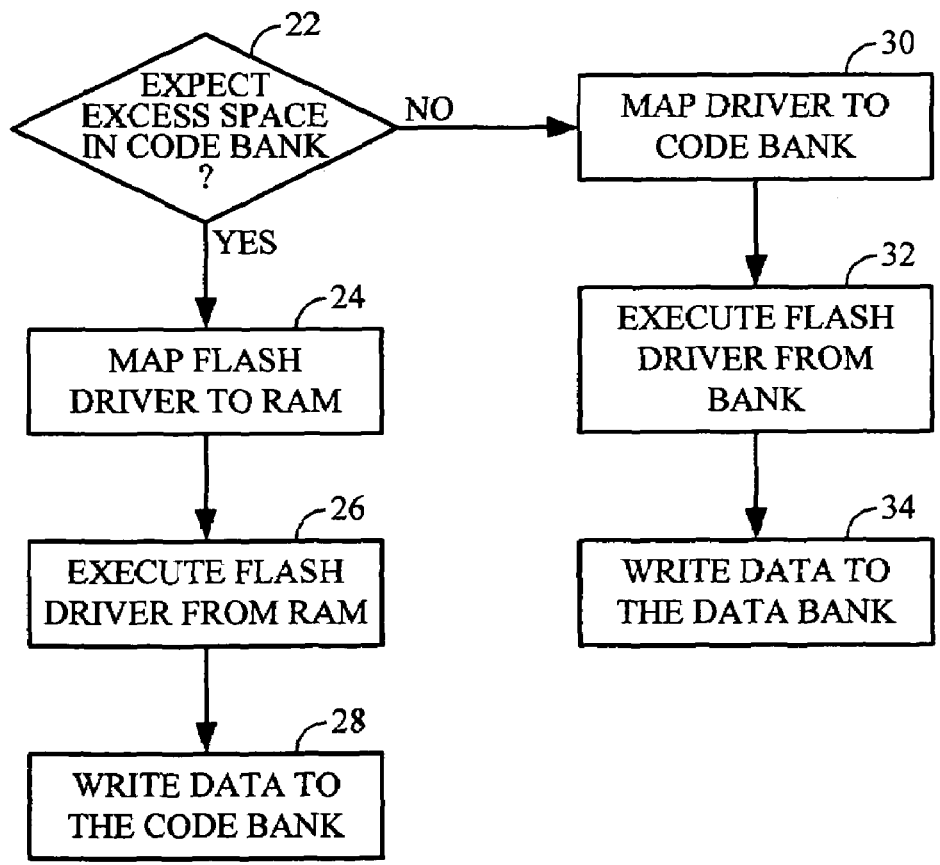
FIG. 2 is a flow chart of the present logic.

More particularly, FIG. 2, which shows the logic of the present invention, indicates that at decision diamond 22 it is determined whether excess space is expected to be available in the code bank 18 for, e.g., the expected applications to be run by the device 10. If so, the logic moves to block 24 wherein, e.g., at compile time, the flash driver is mapped to the RAM 14 for subsequent execution thereof at block 26 during device 10 operation, e.g., for writing data to the code bank 18, at block 28. However, if it is determined that the code bank 18 might not have excess space, the logic moves from decision diamond 22 to block 30 to map the flash driver to the code bank 18, for subsequent execution thereof at block 32, e.g., writing data to the databank 20, at block 34.

In another embodiment, the above-described mapping can be done dynamically at execution time.

In any case, when the flash driver is executed from the RAM 14, the flash driver is prevented from executing code from the code bank 18 while performing operations (such as program or erase operations) on the flash memory 16.

While the particular SYSTEM AND METHOD FOR OPERATING DUAL BANK READ-WHILE-WRITE FLASH as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. '112, sixth paragraph, unless the element is expressly recited using the phrase "means for" or, in the case of a method claim, the element is recited as a "step" instead of an "act".

What is claimed is:

1. A method for storing data in a flash memory device having at least a code bank and a data bank, comprising:
   writing data to the data bank under control of a flash driver in the code bank when sufficient space is expected to exist in the data bank; otherwise
   writing data to the code bank under control of a flash driver in a storage device external to the flash memory device.

2. The method of claim 1, wherein the flash memory device is accessed by a wireless communication device processor.

3. The method of claim 2, wherein the storage device external to the flash memory device is a RAM accessed by the processor.

4. The method of claim 3, wherein copies of the flash driver are in both the RAM and the code bank.

5. The method of claim 1, further comprising preventing the flash driver from accessing code in the code bank when performing operations on the flash memory device.

6. A system for storing data in a flash memory device having at least a code bank and a data bank, comprising:
   means for writing data to the data bank under control of a flash driver in the code bank when sufficient space is expected to exist in the data bank; and
   means for otherwise writing data to the code bank under control of a flash driver in a storage device external to the flash memory device.

7. The system of claim 6, wherein the flash memory device is accessed by a wireless communication device processor.

8. The system of claim 7, wherein the storage device external to the flash memory device is a RAM accessed by the processor.

9. The system of claim 6, wherein copies of the flash driver are in both the RAM and the code bank.

10. The system of claim 6, comprising means for preventing the flash driver from accessing code in the code bank when performing operations on the flash memory device.

11. A computer-readable medium embodying codes for implementing a method for storing data in a flash memory device having at least a code bank and a data bank, the method comprising:
    writing data to the data bank under control of a flash driver in the code bank when sufficient space is expected to exist in the data bank; otherwise
    writing data to the code bank under control of a flash driver in a storage device external to the flash memory device.

12. The medium of claim 11, the method further comprising preventing the flash driver from accessing code in the code bank when performing operations on the flash memory device.

13. The method of claim 1, wherein writing data to the code bank further comprises preventing access to the flash driver in the code bank.

14. The method of claim 1, further comprising mapping of the flash driver to at least one of the code bank and the storage device at a compile time.

15. The method of claim 1, further comprising mapping of the flash driver to at least one of the code bank and the storage device at a execution time.

16. A wireless communication device, comprising:
    a processor;
    a flash memory device comprising a code bank and a data bank, wherein the code bank comprises a local copy of a flash driver operable to be accessed by the processor to perform operations on the data bank; and
    a storage device, external from the flash memory device, comprising an external copy of the flash driver operable to be accessed by the processor to store data in the code bank, wherein the processor is operable to access only the local copy of the flash driver to perform the operations on the data bank, and further wherein the processor is operable to access only the external copy of the flash driver to store the data on the code bank when the code bank has space to store the data.

17. A method for storing data in a read-while-write flash memory device having a code bank and a data bank, comprising;
    determining if space is expected to exist in the code bank in which to write application data;
    mapping a flash driver to a storage device external from the flash memory device if the space is expected to exist in the code bank, and writing at least a portion of the application data to the code bank under control of the flash driver in the storage device; and
    mapping a flash driver to the code bank on the flash memory device if the space is not expected to exist in the code bank, and writing the application data to the data bank under control of the flash driver in the code bank.

18. The method of claim 17, wherein the mapping of the flash driver to the storage device and the mapping of the flash driver to the code bank each further comprises mapping at compile time.

19. The method of claim 17, wherein the mapping of the flash driver to the storage device and the mapping of the flash driver to the code bank each further comprises mapping dynamically at execution time.

20. The method of claim 17, further comprising preventing access to the flash driver mapped to the code bank when writing the application data to the code bank.

* * * * *